US009941445B2

(12) United States Patent
Escoubas et al.

(10) Patent No.: US 9,941,445 B2
(45) Date of Patent: Apr. 10, 2018

(54) METHOD FOR RANDOMLY TEXTURING A SEMICONDUCTOR SUBSTRATE

(71) Applicants: UNIVERSITÉ D'AIX-MARSEILLE, Marseilles (FR); CENTRE NATIONAL DE LA RECHERCHE SCIENTIFIQUE, Paris (FR); THALES, Neuilly sur Seine (FR)

(72) Inventors: Ludovic Escoubas, Marseilles (FR); Gerard Jean Louis Berginc, Thiais (FR); Jean-Jacques Simon, Peypin (FR); Vincent Brissonneau, St Maximin la Sainte Baume (FR)

(73) Assignees: UNIVERSITÉ D'AIX-MARSEILLE, Marseilles (FR); CENTRE NATIONAL DE LA RECHERCHE SCIENTIFIQUE, Paris (FR); THALES, Neuilly sur Seine (FR)

( * ) Notice: Subject to any disclaimer, the term of this patent is extended or adjusted under 35 U.S.C. 154(b) by 0 days.

(21) Appl. No.: 15/316,387

(22) PCT Filed: Jun. 2, 2015

(86) PCT No.: PCT/IB2015/054176
§ 371 (c)(1),
(2) Date: Dec. 5, 2016

(87) PCT Pub. No.: WO2015/186064
PCT Pub. Date: Dec. 10, 2015

(65) Prior Publication Data
US 2017/0141264 A1 May 18, 2017

(30) Foreign Application Priority Data
Jun. 4, 2014 (FR) ..................... 14 55068

(51) Int. Cl.
*H01L 33/22* (2010.01)
*H01L 27/146* (2006.01)
*H01L 31/0236* (2006.01)

(52) U.S. Cl.
CPC ........ *H01L 33/22* (2013.01); *H01L 27/14625* (2013.01); *H01L 27/14685* (2013.01);
(Continued)

(58) Field of Classification Search
None
See application file for complete search history.

(56) References Cited

U.S. PATENT DOCUMENTS

2003/0181057 A1\* 9/2003 Sakai .................. H01L 21/0337
438/712
2006/0278608 A1\* 12/2006 Hoffman ........... H01J 37/32935
216/61

(Continued)

FOREIGN PATENT DOCUMENTS

EP 1345275 A1 9/2003
FR 2981196 A1 4/2013

OTHER PUBLICATIONS

Aug. 11, 2015 Written Opinion issued in International Patent Application No. PCT/IB2015/054176.
Aug. 11, 2015 International Search Report issued in International Patent Application No. PCT/IB2015/054176.

*Primary Examiner* — Angel Roman
(74) *Attorney, Agent, or Firm* — Oliff PLC (57) ABSTRACT

The invention relates to a method for texturing a semiconductor substrate (1), comprising steps consisting in forming a plurality of cavities of random shapes, depths and distribution, in an etch mask (2), by means of non-homogeneous reactive-ion etching, forming a first rough random design, and etching the substrate using the etch mask, by means of reactive-ion etching, in such a way as to transfer the first
(Continued)

rough random design into the substrate and to produce a second rough random design (200), comprising cavities (20) of random shapes, depths (d2r) and distribution, on the surface of the substrate.

12 Claims, 4 Drawing Sheets

(52) U.S. Cl.
CPC .. *H01L 31/02363* (2013.01); *H01L 27/14621* (2013.01); *H01L 27/14627* (2013.01); *H01L 27/14643* (2013.01)

(56) References Cited

U.S. PATENT DOCUMENTS

| | | | |
|---|---|---|---|
| 2008/0290346 A1* | 11/2008 | Shim | H01L 33/325 257/76 |
| 2009/0183992 A1* | 7/2009 | Fredenberg | B81C 99/0085 205/82 |
| 2013/0128362 A1* | 5/2013 | Song | B82Y 20/00 359/601 |
| 2014/0011013 A1* | 1/2014 | Jin | B05D 5/08 428/297.4 |
| 2014/0030830 A1* | 1/2014 | Lee | H01L 51/5268 438/29 |

* cited by examiner

ABSTRACT NOT APPLICABLE

METHOD FOR RANDOMLY TEXTURING A SEMICONDUCTOR SUBSTRATE

The present invention relates to a method for randomly texturing a semiconductor substrate.

It is well known that texturing a semiconductor substrate, i.e. giving the substrate a controlled roughness, enables its optical absorption to be increased in the visible or infrared spectrum. Texturing techniques thus have various applications in the field of manufacturing light-receiving or light-transmitting optoelectronic components, in particular imagers and photovoltaic cells, to produce non-reflecting photofunctional surfaces (receiving and transmitting surfaces) that improve the performances of these components.

The present invention relates more particularly to the texturing of a semiconductor substrate by means of reactive-ion etching, this technique combining chemical etching and physical etching from a same ionized gaseous composition.

The article "Silicon surface texturing by reactive ion etching" by H. F. W. Dekkers, F. Duerinckx, J. Szlufcik and J. NilS, OPTO-ELECTRONICS REVIEW 8(4), 311-3 16 (2000), describes a method for texturing a silicon substrate of the [111]-type consisting of applying the reactive-ion etching process to the substrate. Such a method, often used for the processing of photovoltaic cells, only obtains roughnesses of low amplitude, i.e. less than one micrometer, and a slight reduction in the reflectivity of the material in wavelengths of the order of 400-750 nm, i.e. in the visible spectrum. Moreover, the etching process stops spontaneously when the [111] crystalline structure is reorganized on the surface of the substrate.

The present invention also aims to provide a better roughness, and more particularly to produce rough designs of a depth of the order of one micrometer to a few micrometers, enabling absorption in the near-infrared to be improved, and more particularly in the range of wavelengths from 1,000 to 1,200 nm where most night-imaging applications are situated, such as infrared video-surveillance or night vision.

It can be shown that the absorption rate offered by an ordered and homogeneous rough surface, for example a regular network of substantially identical cavities, depends on the depth of its constituent cavities and on their period, and that the wavelength at which the network has maximum absorption depends on the period of these cavities. For example, the absorption of a network of identical cavities with a period of the order of one micrometer and a depth also of the order of one micrometer is maximal in the vicinity of the 1,000 nm wavelength.

To obtain a higher roughness than the one provided by directly etching a substrate, one well-known method involves using an etch mask.

For example, application WO 2010/109692 describes a method for making a substrate rough comprising steps of depositing a hard mask on the substrate, making openings in the mask by means of a laser, applying wet isotropic etching to the substrate by means of an acid solution, through the openings, to form troughs in the substrate, then applying a wet anisotropic etching of the troughs by means of an alkaline solution, again through the openings, to produce cavities of inverted pyramidal shape.

In the same vein, patent application FR 2 981 196 describes a method for structuring a semiconductor substrate by etching the latter through a sacrificial layer previously etched by photolithography so as to form islands. This method enables cavities of substantially homogeneous shapes to be obtained, having substantially identical dimensions and shapes, in particular in the shape of a "V" or "U", of a depth in the order of approximately ten micrometers and up to a few tens of micrometers.

Though these various methods enable very deep cavities to be produced, they also have the disadvantage of enabling only regular, ordered and homogeneous structures to be produced.

Now, it can also be shown that a surface of random roughness has the advantage, against a surface consisting of homogeneous structures, of providing low reflectivity over a wide range of wavelengths. Indeed, it can be schematically considered that a design of random roughness is equivalent to the sum of a set of periodical networks each made up of cavities having identical depths, but having between them variations in depths and spatial period following a probability law, for example a Gaussian law. Such a design of random roughness has a large spectrum of absorption by combining the absorptions of each of the networks virtually constituting it, each network having a maximum absorption at a wavelength different from that of the others.

It could thus be desired to provide a method whereby it is possible to produce a rough surface that is not "deterministic" (i.e. having a digitally generated rough design) and that has a rough random design defined by a probability law.

The article "Statistically modified surfaces: experimental solutions for controlled scattered light" by V. Brissonneau, F. Flory, L. Escoubas, G. Berginc, J. Appl. Phys. 112, 114325 (2012), describes a method enabling such an objective to be achieved. The method comprises a step of forming, on the substrate to be textured, a layer of light-sensitive resin comprising a first rough design made up of cavities of random shapes, depths and distributions. This design is obtained by a step of pre-insolating the layer of resin, followed by a step of randomly insolating the latter by means of a beam of laser light, then by a step of developing the insolated resin. The random insolation is implemented by means of a spatial light modulator using an array of micro-mirrors, associated with an element for diffusing the laser beam. The distribution of the depths of the cavities made in the resin, or "peak-valley heights", follows an exponential probability law and is between 0.4 and 1.6 micrometers.

The method then comprises a step of transferring the rough random design onto the substrate, by means of reactive-ion etching of the substrate through the layer of resin. As the substrate is etched more rapidly than the resin due to its high reactivity to the chemical agents of the reactive gas, a phenomenon of "amplification" of the relief of the initial rough design occurs when the latter is transferred, the depths of the cavities obtained being increased by a factor of the order of 2.5 in the experimental conditions described by the article. On the other hand, this increase in the relief does not affect the distribution law of the depths of cavities, which remains unchanged, such that the roughness obtained on the semiconductor is itself random.

However, this method has the disadvantage of being complex to implement, the insolation of a resin by means of a spatial light modulator being little suited to industrial manufacturing of components in the microelectronics industry.

Therefore, it could be desired to provide a method for randomly texturing a semiconductor substrate not requiring any spatial light modulator.

For this purpose, the present invention is based on the observation that the reactive-ion etching process is, by nature, an inhomogeneous process at microscopic scale. Such a process, if it is controlled in an appropriate manner as described below, generates on the surface of the etched material microscopic cavities of random depths and period, equivalent to the sum of a set of periodical networks each made up of cavities having identical depths and a constant period. The present invention is also based on the observation, highlighted by the aforementioned document, that the transfer of a rough random design produced on a resin onto a substrate has the effect of increasing the depth of the design, without altering its random nature. The present invention is thus based on the principle of "amplifying", by this transfer technique, a rough random design produced by using the inhomogeneity property of the reactive-ion etching.

More particularly, some embodiments of the present invention relate to a method for randomly texturing a photofunctional surface of a semiconductor substrate of a light-transmitting or light-receiving component, comprising steps of depositing an etch mask on the substrate, forming a plurality of cavities of random shapes, depths and distribution, in the etch mask, by means of non-homogeneous reactive-ion etching, the plurality of cavities forming a first rough random design, and transferring into the substrate, by means of reactive-ion etching of the substrate through the etch mask, the first rough random design, to produce a second rough random design comprising cavities of random shapes, depths and distribution, on the surface of the substrate.

According to one embodiment, the method comprises a control of the energy of the ions ensuring the reactive-ion etching independently of the density control of these ions.

According to one embodiment, the material of the etch mask is chosen so as to have an etching speed slower than the substrate etching speed, with identical etching parameters, so that the random depth of the cavities of the second rough random design is statistically greater than the random depth of the cavities of the first rough random design.

According to one embodiment, the substrate etching speed is at least 10 times faster than the mask etching speed.

According to one embodiment, the etch mask comprises a material included in the group comprising: light-sensitive resins, metals, an oxide or a silicon nitride.

According to one embodiment, the step of transferring the first rough random design is continued until the etch mask disappears.

According to one embodiment, the step of transferring the first rough random design is followed by a step of removing residues of the etch mask.

According to one embodiment, the step of forming cavities in the etch mask is performed with first reactive-ion etching parameters, until orifices reaching the substrate appear, and the step of transferring the first rough random design is essentially performed with second reactive-ion etching parameters, chosen so as to slow down the mask etching speed in relation to the speed at which the mask would be etched if the first reactive-ion etching parameters were maintained.

According to one embodiment, the beginning of the step of transferring the first rough random design into the substrate is detected by detecting the presence of atoms of the material of the substrate in a reactive-ion etching reactor.

According to one embodiment, the etching parameters include at least one of the following parameters: the pressure of a reactive gas in an etching reactor, the voltage applied to electrodes for ionizing the reactive gas, and the composition of the reactive gas.

According to one embodiment, the substrate is a single-crystal substrate.

Some embodiments of the present invention also relate to a method for manufacturing a light-transmitting or light-receiving semiconductor component, comprising a step of randomly texturing the surface of the substrate of the component by means of the method according to the present invention.

Some embodiments of the method of the present invention will be described below, in relation with, but not limited to, the appended drawings, in which.

Figure 1:
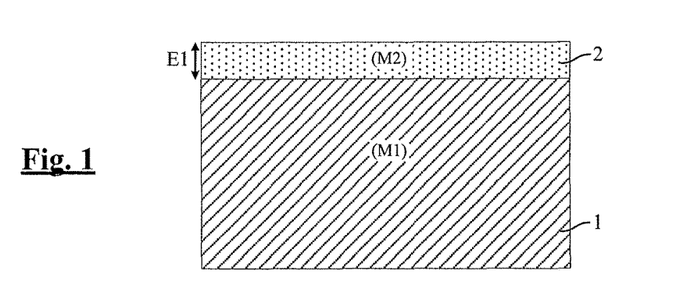
FIG. 1 shows a preparatory step of depositing an etch mask on a substrate the surface of which must be randomly textured, FIG. 2 schematically shows an example of implementation, in a reactive-ion etching reactor, of the method of random texturing according to the present invention.

FIG. 1 schematically shows a preliminary step of depositing an etch mask 2 on a substrate 1 the surface of which must be randomly textured by means of the method according to the present invention. The substrate 1 is made of a semiconductor material M1 and the etch mask of a material M2. The material M2 is preferably chosen so as to have a reactive-ion etching speed slower than the material M1 etching speed, with identical etching parameters. According to one embodiment of the method, the material M1 etching speed is at least 10 times faster than that of the material M2.

The material M1 is for example single-crystal silicon, and the material M2 is for example a positive light-sensitive resin deposited by centrifugation. The etch mask 2 has a thickness E1, for example 1 micrometer. This thickness is preferably as constant as possible at the atomic scale, so that variations in this thickness do not interfere with the inhomogeneous etching process of the mask described below.

Figure 2:
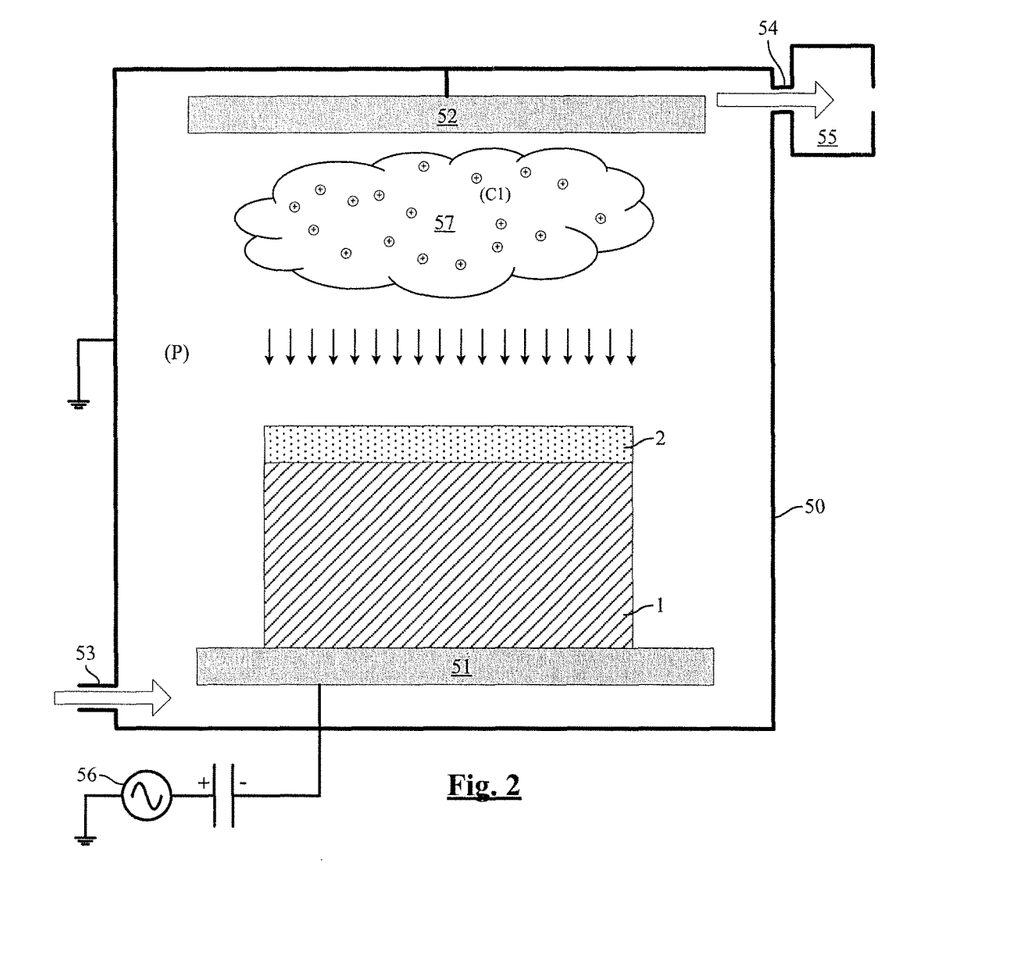

The random texturing method according to the present invention is implemented here by means of a reactive-ion etching reactor 50 with parallel electrodes, shown schematically on FIG. 2. The reactor 50 comprises a lower electrode 51 used as support for the substrate 1, an upper electrode 52, a gas inlet 53, and a gas exhaust 54 linked to a vacuum pump (not shown) enabling a very low pressure P to be maintained in the reactor. A gas analyzer 55, for example a mass spectrometer, associated with a flowmeter, may be provided at the exhaust of the reactor. The lower electrode 51 is capacitively coupled to an alternating voltage generator 56. The walls of the reactor 50 and the upper electrode 52 are linked to the ground of the generator 56. The generator 56 applies an alternating electric field to the lower electrode, oscillating for example at 13.56 Mhz, and supplies an adjustable electrical power, for example of the order of about one hundred watts.

The random texturing method comprises two phases:
a phase P1 of etching the etch mask 2 by means of reactive-ion etching,
a phase P2 of etching the substrate 1 using the etch mask 2, also by means of reactive-ion etching.

Phase P1

To initiate phase P1, a reactive gas 57 of composition C1, for example a fluorinated gas such as tetrafluoromethane CF4, is injected into the reactor 50. An oscillating electric field, present between the electrodes 51, 52, ionizes the gas molecules by extracting electrons therefrom, causing an ionized gas (plasma) to appear containing positive ions (cations) and free electrons. The free electrons are ejected from the gaseous mass whereas the cations, that are heavier and less reactive to the variations of the electric field, initially remain in suspension between the electrodes. The electrons that reach the walls of the reactor 50 or the upper electrode 52 are evacuated by the mass of the generator 56, whereas those reaching the lower electrode charge the latter to a negative static potential. When the difference in static potential between the electrodes 51, 52 reaches a certain threshold, the ions attracted by the negative electrode 51 are greatly accelerated by the electric field and are cast onto the surface of the substrate 1, here on the mask 2.

This etching process is anisotropic and comprises two process components acting jointly on the surface bombarded with the ions:
a chemical etching process: the ions chemically react with the bombarded surface, generally after capturing free electrons in the vicinity of the surface and forming radicals,
a physical etching process (plasma etching) related to the kinetic energy of the cations, that extract atoms from the bombarded surface by means of kinetic energy transfer.

The chemical etching process is generally little active on the mask, the etching of which is essentially performed by physical etching. However, the operator can at all times control the physical etching speed and the reactive etching speed by acting on etching parameters such as the gas concentration, the inter-electrode voltage, or the gas composition.

Figures 3A, 3B:
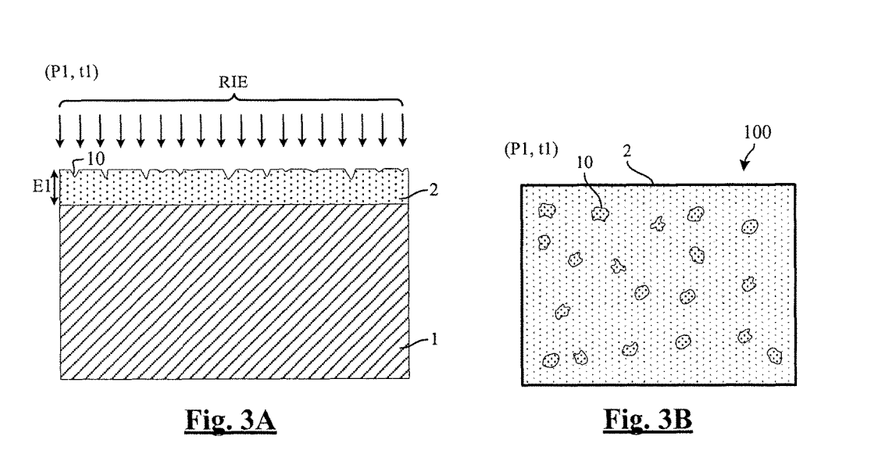
FIGS. 3A and 3B are respectively cross-sectional and top views of the substrate and of the etch mask at a first time of a first phase of the texturing method.

FIGS. 3A and 3B are highly magnified cross-sectional and top views of a portion of the substrate 1 and of the etch mask 2 at an initial time t1 of phase P1. As the reactive-ion etching process is configured according to the method of the present invention to be inhomogeneous and random, microscopic cavities 10 of random shapes, depths and distribution appear on the surface of the mask 2.

Figures 4A, 4B:
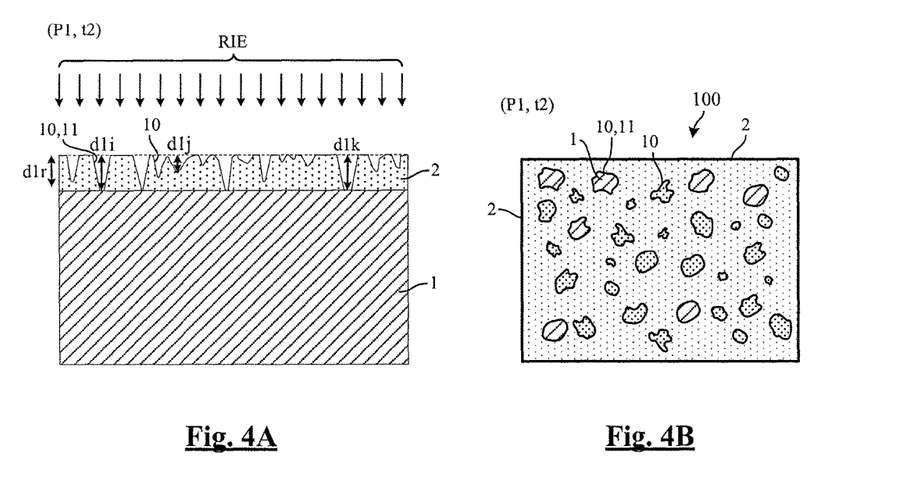
FIGS. 4A and 4B are respectively cross-sectional and top views of the substrate and of the etch mask at a second time of a first phase of the texturing method.

FIGS. 4A and 4B are cross-sectional and top views of the same portion of the substrate and of the mask, at a final time t2 of phase P1. Certain cavities 10 have become orifices 11 passing through the mask 2 whereas new cavities 10 have appeared. The assembly forms a rough random design 100 made up of cavities of random shapes, depths d1$i$, d1$j$, d1$k$ and distribution.

According to the method of the present invention, obtaining this rough random design made up of cavities of random shapes, depths and distribution, requires controlling the etching process so that it is perfectly inhomogeneous. This inhomogeneity is particularly controlled by adjusting the following parameters:
the temperature of the substrate,
the flow rate of injected gases,
the pressure inside the reactor,
the flow of ions bombarding the surface to be etched, also referred to as ion density, or even "RF power of the source",
the energy of these ions, or "bias power applied to the substrate".

Generally speaking, the nature and the flow rate of the injected gases, the pressure inside the reactor, the RF power of the source and the bias power are closely related parameters whose respective values cause the inhomogeneity of the plasma and of the etching obtained.

A key parameter of the method is the bias power applied to the substrate, i.e. the energy of the ions. Obtaining a roughness as shown on FIGS. 4A, 4B requires acting on the bias power, by increasing this power until the desired result is reached. It is thus preferable to be able to control this parameter independently of the others, by choosing an appropriate reactor. A range of typical bias power values is 10 W-100 W.

The etching reactor used should thus, preferably, make it possible to independently control the energy of the ions (bias power) and the flow of ions (RF power of the source). It should also make it possible to regulate the temperature of the substrate, for example around 50° C. (this generally being obtained by means of a liquid flowing between the substrate and the substrate holder), to operate at low pressure, for example a pressure lower than 6.6661 Pa (50 mTorr), and to operate at high ion densities, for example above $10^{10}$ cm$^{-3}$.

For this purpose, two main categories of so-called "high density" plasma reactors may be used, that differ by the way the electrical power is coupled to the plasma: reactors using a so-called "ECR" ("Electron Cyclotron Resonance") coupling exciting progressive waves, and ICP ("Inductive Coupled Plasma") inductive coupling reactors. High density reactors offer the advantage, in addition to operating at low pressure (a few tens of Pa, i.e. a few mTorr), of independently controlling the flow and energy of the ions that bombard the region to be etched. For this purpose, these two types of reactors use two RF generators:
the first enables the creation of the plasma via inductive coupling (most often of ICP type) and thus the control of the ionic flow bombarding the substrate (RF power of the source),
the second is capacitively coupled to the substrate and enables the energy of the ions bombarding the latter (bias power) to be controlled. These two types of RF generators use different frequencies, typically 12.56 MHz for the first one and 13.56 MHz for the second.

Phase P2

The phase P2 of etching the substrate is initiated when the first orifices 11 appear in the etch mask 2. Phase P2 is preferably implemented with reactive-ion etching parameters different from those of phase P1, chosen so as to slow down the mask etching speed in relation to the speed at which it would be etched if the etching parameters of phase P1 were maintained, while maintaining the inhomogeneity of the etching process.

The time at which phase 2 is initiated may be detected by means of the gas analyzer 55 and of the flowmeter, by detecting atoms of the material M1 of the substrate in the gas extracted from the reactor 50, here silicon atoms or derivative compounds, for example silicon dioxide if the etching is done in the presence of oxygen. Alternatively, the end of phase P1 may be determined by timing, after calibration of the method. Phase P1 can also, in some embodiments of the method of the present invention, overlap phase P2, i.e. comprise a beginning of etching of the substrate that continues during phase P2 with different etching parameters. Furthermore, in other embodiments, phases P1 and P2 may be merged and conducted without changing the etching parameters, such that it is then not necessary to detect the end of phase P1.

Figure 5:
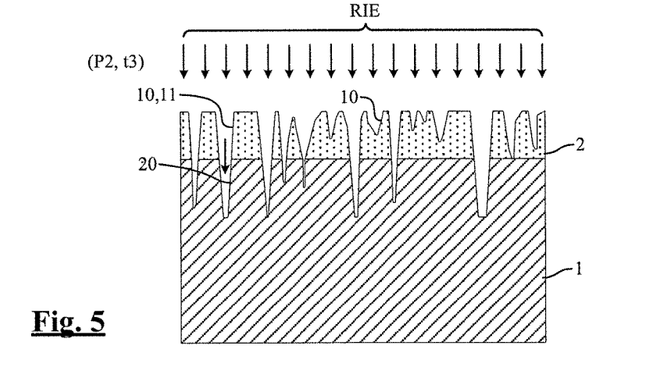
FIG. 5 is a cross-sectional view of the substrate and of the etch mask at a first time of a second phase of the texturing method.

FIG. 5 is a cross-sectional view of the above-mentioned portion of the substrate 1 and of the mask 2 at a time t3 occurring shortly after the beginning of phase P2. Cavities 20 rapidly appear in the substrate 1 by etching the latter through the orifices 11 of the mask, whereas new cavities 10 appear in the mask 2 and others turn into orifices 11, with an etching speed slower than that of the substrate 1.

Figure 6:
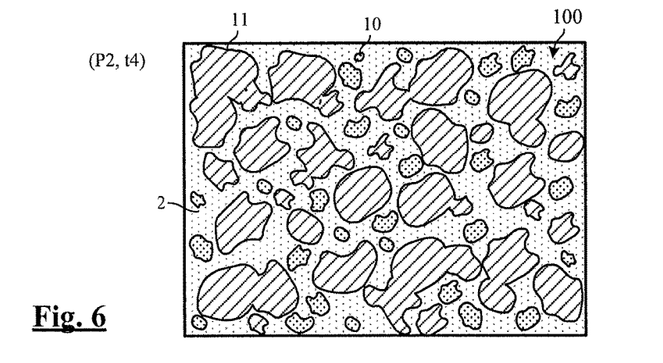
FIG. 6 is a top view of the substrate and of the etch mask at a second time of the second phase.

FIG. 6 is a top view of the above-mentioned portion of the mask 2 at a subsequent time t4 of phase P2. The cavities 10 created during phase 1 have been mainly turned into orifices 11 with a larger opening, some of which have joined to form orifices with an even larger opening, through which cavities 20 have been etched in the substrate, while new cavities 10 have appeared in the mask and others have turned into orifices 11.

Figure 7:
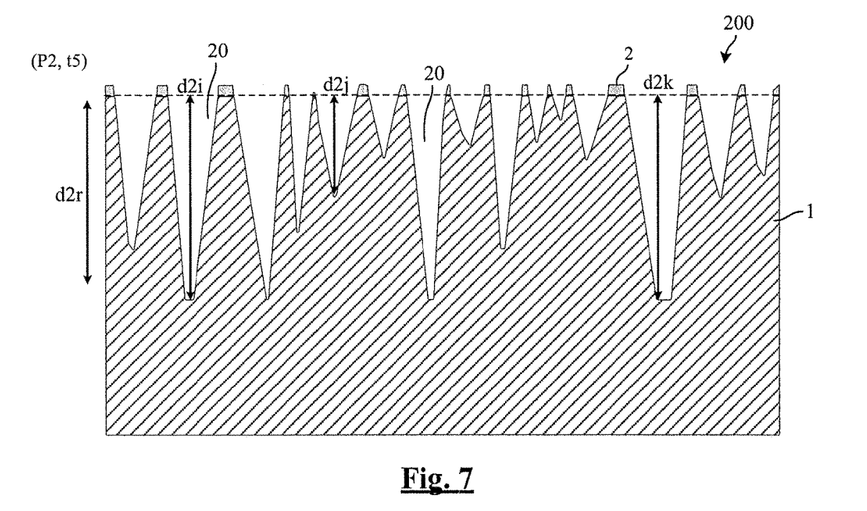
FIG. 7 is a cross-sectional view of the substrate and of the etch mask at a third time of the second phase.

FIG. 7 is a cross-sectional view of the above-mentioned portion of the substrate 1 and of the mask 2 at a final or almost final time t5 of phase P2. The mask 2 is now very thin, of one to a few atomic layers. The substrate 1 has a rough random design 200 comprising a plurality of cavities 20 of random shapes, depths and distribution.

Phase P2 may be continued until the mask 2 completely disappears. The disappearance of the mask may be detected by means of the gas analyzer 55, when chemical species characteristic of the material M2 are no longer detectable. Alternatively, phase P2 may be followed by a phase P3 of rinsing the substrate aiming to remove the mask residues, for example rinsing with acetone when the material M2 is a resin.

Phase P2, or where applicable phase P3, may be followed by a phase P4 of implanting dopant onto the surface of the substrate, such a phase being conventional per se and improving the absorption of the rough random surface in a range of wavelengths from 1,200 nm to 1,600 nm. The dopant may for example be Sulfur, and be implanted for example with concentrations of the order of $10^{14}$ to $10^{16}$ atoms·cm-2.

As indicated above, the etching of the substrate through the etch mask thus has the effect of transferring the rough random design 100 of the mask onto the substrate, to obtain the rough random design 200. The depths of the cavities 20 (or peak-valley heights) forming the rough design 200, noted $d2i$, $d2j$, $d2k$ . . . on FIG. 7, depend on the initial depths of the cavities 10 formed in the mask 2 before initiating phase P2, noted $d1i$, $d1j$, $d1k$ . . . on FIG. 4A, with an amplification factor related to the difference in substrate etching speed in relation to that of the mask.

Figure 8:
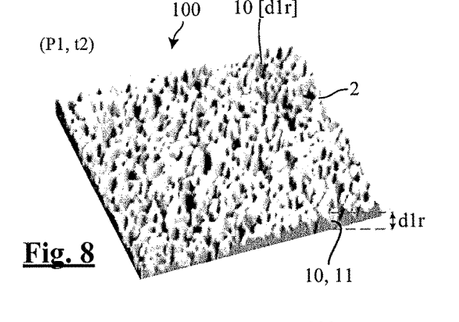
FIG. 8 is a perspective view of the etch mask at the second time of the first phase.
Figure 9:
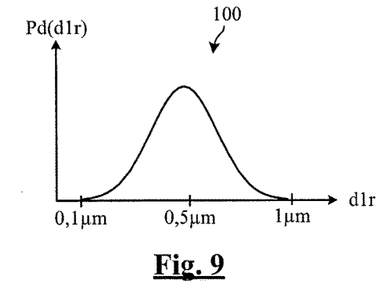
FIG. 9 shows an example of distribution curve of the peak-valley heights of a rough random design present on the mask at the second time of the first phase.
Figures 10, 11, 12, 13:
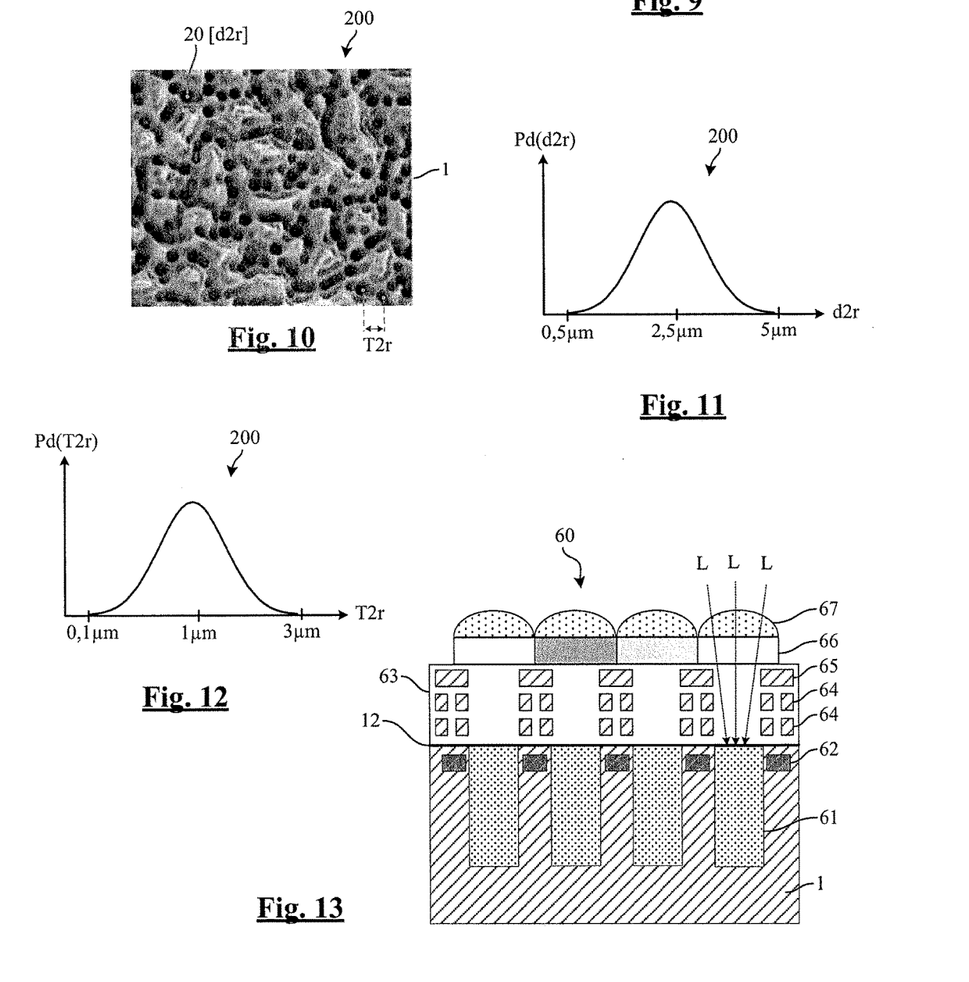
FIG. 10 is a top view of an example of randomly textured substrate according to the method of the present invention.
FIG. 11 shows a distribution curve of the peak-valley heights of a rough random design present on the surface of the substrate in FIG. 10.
FIG. 12 shows a distribution curve of the random spatial period of the rough random design present on the surface of the substrate in FIG. 10.
FIG. 13 is a cross-sectional view of an optoelectronic component produced according to a manufacturing method according to the present invention.

It can be shown that the distribution of the depths of the cavities 20 of the design 200 follows a same probability law as the distribution of the depths of the cavities 10 of the design 100. In other words, the amplification factor of the depths of the cavities does not change their relative probability density. For a better understanding, FIG. 8 shows an example of rough design 100 obtained at the final time t2 of phase P1 (appearance of the orifices 11 and beginning of etching of the substrate) and FIG. 9 shows the probability density $Pd(d1r)$ of the random depths $d1r$ of the cavities constituting this rough design. FIG. 10 shows an aspect of the rough design 200 obtained at the end of phase P2, and FIG. 11 shows the probability density $Pd(d2r)$ of the random depths $d2r$ of the cavities 20 of this rough design. FIGS. 9 and 11 show that the probability densities are identical and each take the form of a Gaussian function. On FIG. 9, the depths $d1r$ of the cavities 10 are between approximately 0.1 micrometer and 1 micrometer. This latter value is imposed here by the thickness E1 of the mask 2 and corresponds to the maximum depth of a cavity 10 that has become an orifice 11. The curve $Pd(d1r)$ has a peak in the vicinity of 0.5 micrometer corresponding to the maximum depth probability of a cavity. On FIG. 11, the depths $d2r$ of the cavities 20 are between approximately 0.5 micrometer and 5 micrometers. The curve $Pd(d2r)$ has a peak in the vicinity of 2.5 micrometers corresponding to the maximum depth probability of a cavity 20. Those skilled in the art will note that these values are examples and may vary in large proportions depending on the materials M1, M2 used and the etching parameters selected.

The spatial distribution of the cavities itself follows a probability law, and FIG. 12 shows as an example the curve $Pd(T2r)$ of the probability density of the random spatial period $T2r$ of the network of cavities 20, considered here as the sum of a set of networks of cavities of constant spatial period. In this example, the random spatial period $T2r$ is between 0.1 micrometer and 3 micrometers and the function $Pd(T2r)$ has a peak in the vicinity of the micrometer, corresponding to the highest probability of spatial period, thus of distance, between two cavities. Those skilled in the art will note that the example of probability laws shown on FIGS. 9, 11 and 12, here Gaussian laws, are purely illustrative and only reflect the experiments conducted. It is therefore possible that other probability laws may be obtained with alternatives of the method of the present invention.

As indicated above, such a design of random roughness 200 has a large spectrum of absorption by combining the absorptions of each of the networks virtually constituting it, each network having a maximum absorption at a wavelength different from that of the others. In particular, a rough design having the above-mentioned structural features (FIGS. 9, 11, 12) and produced on a silicon substrate has an excellent absorption of the order of 100% between 800 nm and 1,000 nm, from 70 to 80% between 1,000 nm and 1,100 nm (infrared vision), and of the order of 20% beyond 1,200 nm and up to 1,600 nm, which may be improved by the doping phase P4.

The random texturing method according to this invention is susceptible of various embodiments. It may be applied to various types of semiconductor substrates, whether doped or not, preferably single-crystal, made of silicon, germanium, zinc sulfide (ZnS), zinc selenide (ZnSe), and generally speaking all single-crystal substrates. Furthermore, experiments could be conducted on multi-crystal substrates, to determine the applicability of the method to this type of substrate. In some embodiments, the mask 2 may be made of Chrome or Aluminum. The mask is then deposited under vacuum with a thin layer technology, and may be very thin, for example 0.1 μm. Various types of light-sensitive resin may also be used, both negative and positive. A mask made of positive resin has a typical thickness of the order of 0.5 micrometer to 2 micrometers while a mask made of negative resin may have a thickness of up to 8 micrometers. Some embodiments of the method may also use a mask made of silicon oxide ($SiO_2$) or silicon nitride (Si3N4) of a typical thickness from 0.3 micrometer to 2 micrometers, formed by Chemical Vapor Deposition. Generally speaking, the choice of various combinations of materials M1 and M2 is within the understanding of those skilled in the art, possibly after prior experiments to validate the choice considered. Furthermore, the reactive-ion etching process may be implemented with various reactive gases, in particular fluorinated or chlorinated gases, such as tetrafluoromethane (CF4) or sulfur hexafluoride (SF6), with or without oxygen, the presence of oxygen resulting in simultaneously passivating the substrate if the latter is made of silicon.

The random texturing method according to this invention is also susceptible of various applications, in particular in the framework of the manufacturing of light-receiving or light-transmitting optoelectronic components requiring a photofunctional antireflective surface to optimize the collection or transmission of photons, for example photovoltaic cells and image sensors. As an example, FIG. 13 schematically shows a CMOS imager 60 produced according to a manufacturing method according to the present invention including a step of random texturing of the photofunctional surface of the imager. After implanting photodiodes 61 and transistors 62 into the substrate 1 of the imager, and various interconnection elements not showed for the sake of simplicity of the drawing, the surface 12 of the substrate 1 is subjected to a texturing method according to the present invention. After removing the random etch mask and possibly doping the substrate, the latter is covered with a dielectric layer 63 receiving interconnection tracks 64 made of metal and a light mask 65, then with an RGB color filter 66 and microlenses 67 that focus incident light rays (L) on the regions of photodiodes 61.

The invention claimed is:

1. A method for randomly texturing a photofunctional surface of a semiconductor substrate of a light-transmitting or light-receiving component, comprising steps of:
    depositing on the substrate a homogenous etch mask comprising a homogenous material,
    subjecting the substrate with the homogenous etch mask to a non-homogeneous reactive-ion etching, to form a plurality of cavities of random shapes, depths and distribution, in the etch mask, the plurality of cavities forming a first rough random design,
    transferring into the substrate, by means of reactive-ion etching of the substrate through the etched etch mask, the first rough random design, to produce a second rough random design comprising cavities of random shapes, depths and distribution, on the surface of the substrate.

2. The method according to claim 1, comprising increasing the inhomogeneity of the etching process by controlling of the energy of the ions ensuring the reactive-ion etching, independently of the density control of these ions.

3. The method according to claim 1, wherein the material of the homogeneous etch mask is chosen so as to have an etching speed slower than the substrate etching speed, with identical etching parameters, so that the random depth of the cavities of the second rough random design is statistically greater than the random depth of the cavities of the first rough random design.

4. The method according to claim 3, wherein the substrate etching speed is at least 10 times faster than the etch mask etching speed.

5. The method according to claim 1, wherein the etch mask comprises a material included in the group comprising: light-sensitive resins, metals, an oxide or a silicon nitride.

6. The method according to claim 1, wherein the step of transferring the first rough random design is continued until the etch mask disappears.

7. The method according to claim 1, wherein the step of transferring the first rough random design is followed by a step of removing residues of the etch mask.

8. The method according to claim 1, wherein:
    the step of forming cavities in the homogeneous etch mask is performed with first reactive-ion etching parameters, until orifices reaching the substrate appear, and
    the step of transferring the first rough random design is essentially performed with second reactive-ion etching parameters, chosen so as to slow down the mask etching speed in relation to the speed at which the etch mask would be etched if the first reactive-ion etching parameters were maintained.

9. The method according to claim 8, wherein the beginning of the step of transferring the first rough random design into the substrate is detected by detecting the presence of atoms of the material of the substrate in a reactive-ion etching reactor.

10. The method according to claim 8, wherein the etching parameters include at least one of the following parameters: the pressure of a reactive gas in an etching reactor, the voltage applied to electrodes for ionizing the reactive gas, and the composition of the reactive gas.

11. The method according to claim 1, wherein the substrate is a single-crystal substrate.

12. A method for manufacturing a light-transmitting or light-receiving semiconductor component, comprising a step of randomly texturing the surface of the substrate of the component by means of the method according to claim 1.

* * * * *